US 011116121B2

(12) United States Patent
Kishida et al.

(10) Patent No.: US 11,116,121 B2
(45) Date of Patent: Sep. 7, 2021

(54) MOUNTING TARGET WORKING DEVICE

(71) Applicant: YAMAHA HATSUDOKI KABUSHIKI KAISHA, Iwata (JP)

(72) Inventors: Akira Kishida, Iwata (JP); Tomoyuki Nozue, Iwata (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 183 days.

(21) Appl. No.: 16/472,124

(22) PCT Filed: Jan. 6, 2017

(86) PCT No.: PCT/JP2017/000275
§ 371 (c)(1),
(2) Date: Jun. 20, 2019

(87) PCT Pub. No.: WO2018/127972
PCT Pub. Date: Jul. 12, 2018

(65) Prior Publication Data
US 2019/0320564 A1    Oct. 17, 2019

(51) Int. Cl.
| H05K 13/04 | (2006.01) |
| H05K 13/08 | (2006.01) |
| H05K 1/02 | (2006.01) |
| H05K 1/18 | (2006.01) |
| H05K 3/34 | (2006.01) |

(Continued)

(52) U.S. Cl.
CPC ....... *H05K 13/0417* (2013.01); *H05K 1/0284* (2013.01); *H05K 1/18* (2013.01); *H05K 3/34* (2013.01); *H05K 13/0061* (2013.01); *H05K 13/02* (2013.01); *H05K 13/0812* (2018.08)

(58) Field of Classification Search
CPC .......... H05K 1/0284; H05K 1/18; H05K 3/34; H05K 13/0061; H05K 13/02; H05K 13/0417; H05K 13/0812
See application file for complete search history.

(56) References Cited

U.S. PATENT DOCUMENTS

| 6,971,161 B1 * | 12/2005 | Maenishi | H05K 13/08 29/832 |
| 9,198,336 B2 * | 11/2015 | Kihara | H05K 13/0413 |

(Continued)

FOREIGN PATENT DOCUMENTS

| CN | 1351817 A | 5/2002 |
| CN | 101557698 A | 10/2009 |
| CN | 103522743 A | 1/2014 |

(Continued)

OTHER PUBLICATIONS

International Search Report issued in PCT/JP2017/000275; dated Mar. 28, 2017.

(Continued)

*Primary Examiner* — Carl J Arbes
(74) *Attorney, Agent, or Firm* — Studebaker & Brackett PC

(57) ABSTRACT

A mounting target working device includes a head unit, a first mounting target work area in which the head unit mounts a component on a first mounting target having a flat plate shape, and a second mounting target work area in which the head unit mounts the component on a second mounting target having a three-dimensional shape as compared with the first mounting target.

11 Claims, 8 Drawing Sheets

(51) Int. Cl.
    *H05K 13/00*     (2006.01)
    *H05K 13/02*     (2006.01)

(56) References Cited

U.S. PATENT DOCUMENTS 9,370,135 B2 *   6/2016   Okada ................ H05K 13/0812
10,123,470 B2 *  11/2018   Itoh .................... H05K 13/0465

FOREIGN PATENT DOCUMENTS

| CN | 205389301 | U | | 7/2016 |
|----|-----------|---|---|--------|
| JP | H0239500 | A | | 2/1990 |
| JP | 11154798 | A | * | 6/1999 |
| JP | 2000307296 | A | | 11/2000 |
| JP | 2004-104075 | A | * | 4/2004 |
| JP | 4769237 | B2 | | 9/2011 |
| JP | 2011529262 | A | | 12/2011 |
| JP | 1922863 | B2 | | 4/2012 |
| JP | 2012119643 | A | | 6/2012 |
| JP | 2014135416 | A | | 7/2014 |
| JP | 5779342 | B2 | * | 9/2015 |
| JP | 2016127187 | A | | 7/2016 |

OTHER PUBLICATIONS

Written Opinion of the International Searching Authority issued in PCT/JP2017/000275; dated Mar. 28, 2017.
An Office Action mailed by the State Intellectual Property Office of the People's Republic of China dated Apr. 20, 2020, which corresponds to Chinese Patent Application No. 201780080710.1. and is related to U.S. Appl. No. 16/472,124.

* cited by examiner

FIG.10
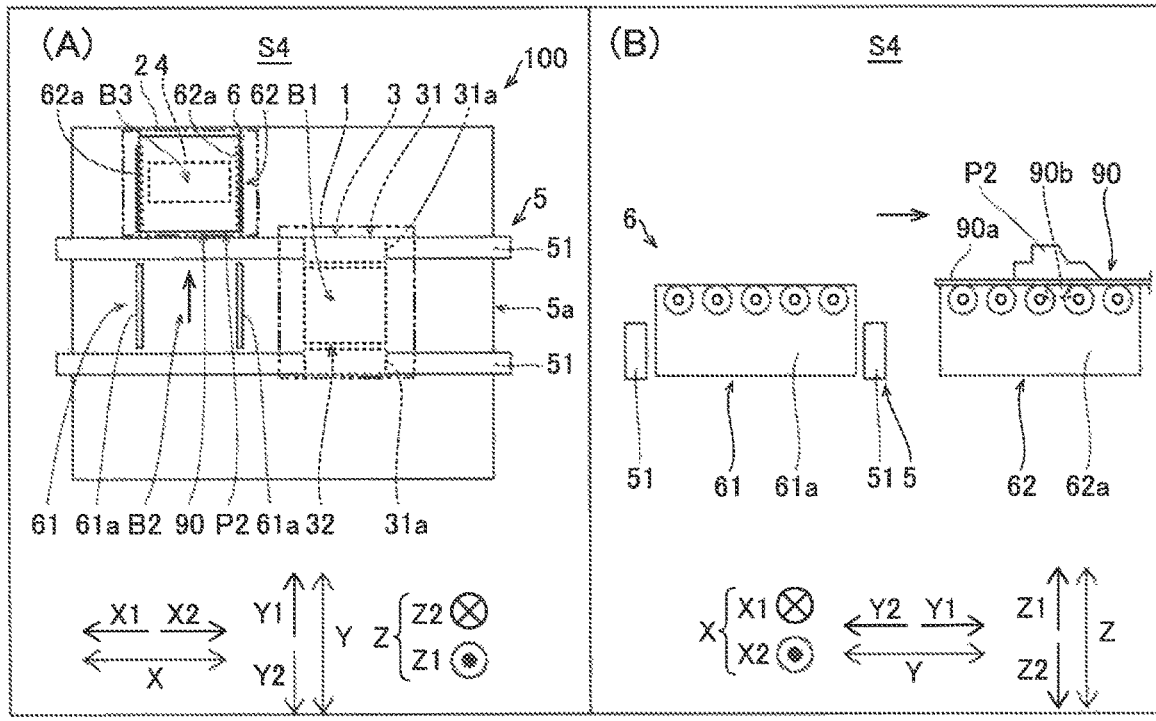
FIG.11
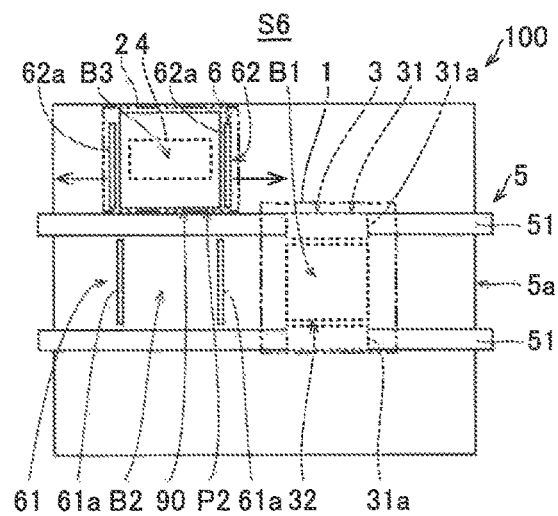
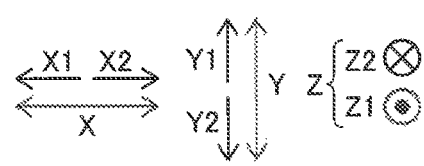

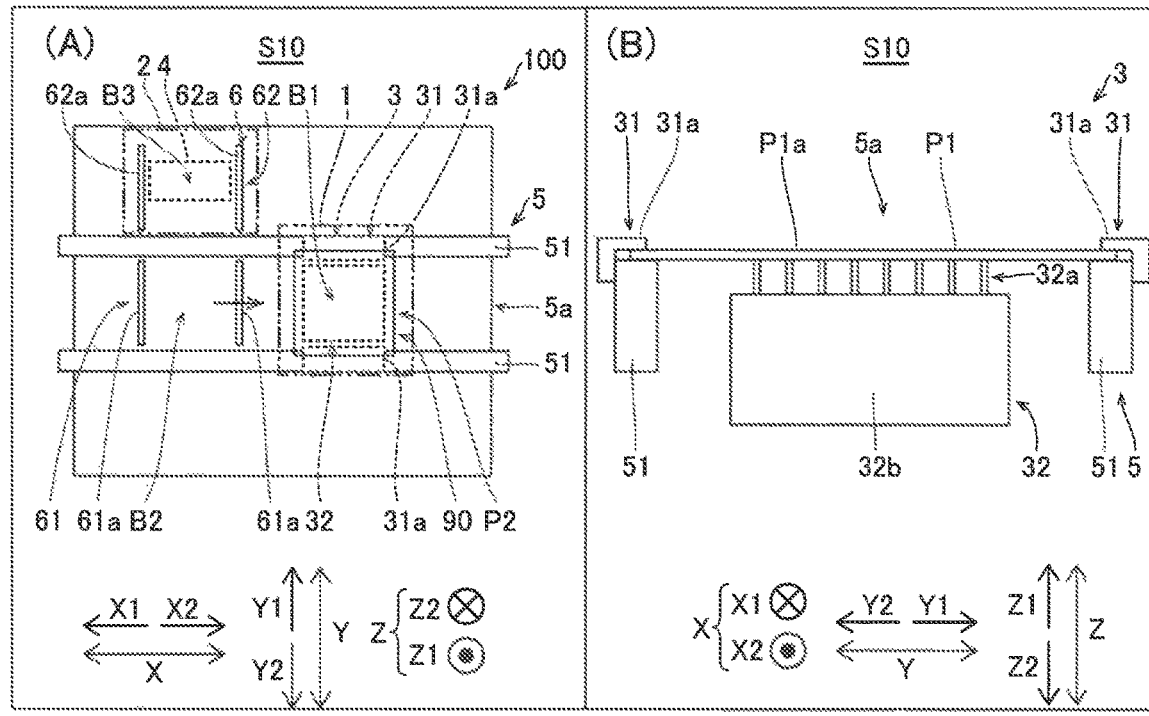
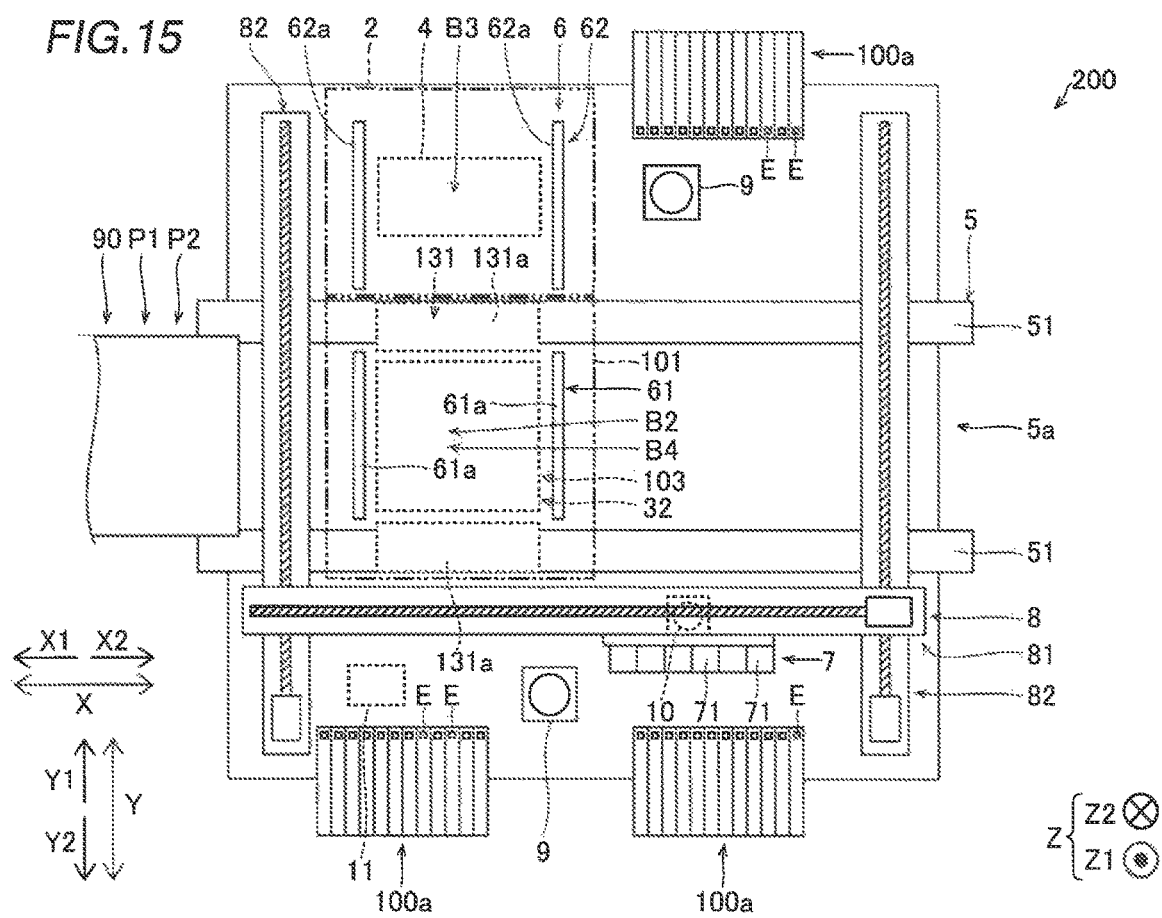

MOUNTING TARGET WORKING DEVICE

This application is a National Stage of International Patent Application No. PCT/JP2017/000275, filed Jan. 6, 2017, the entire content of which is incorporated herein by reference.

BACKGROUND

Technical Field

The present disclosure relates to a mounting target working device.

Background Art

Conventionally, a mounting target working device that mounts components on a substrate is known. Such a mounting target working device is disclosed in Japanese Patent Laid-Open No. 2014-135416.

Japanese Patent Laid-Open No. 2014-135416 discloses an electronic component mounter (mounting target working device) including a substrate conveyance unit that conveys a printed circuit board having a flat plate shape, and a component moving unit that mounts electronic components on the printed circuit board.

SUMMARY

In the technical field of an electronic component mounter as described in Japanese Patent Laid-Open No. 2014-135416, work such as mounting of components may be performed on not only a mounting target (printed board) having a simple shape (flat plate shape) but also a mounting target having a complicated shape as compared with a flat plate shape. However, in the electronic component mounter described in Japanese Patent Laid-Open No. 2014-135416, it is only possible to perform work (mounting) on a mounting target having a simple shape, and there is room for improvement in that work (mounting) cannot be performed on both the mounting target having a simple shape and the mounting target having a complicated shape.

The present disclosure thus provides a mounting target working device capable of performing work on both a mounting target having a simple shape and a mounting target having a complicated shape.

A mounting target working device according to an aspect of the present disclosure includes a head unit, a first mounting target work area in which the head unit performs an operation on a first mounting target having a flat plate shape, and a second mounting target work area in which the head unit performs the operation on a second mounting target having a three-dimensional shape as compared with the first mounting target.

As described above, in the mounting target working device according to this aspect of the present disclosure, the first mounting target work area in which the head unit performs the operation on the first mounting target having a flat plate shape and the second mounting target work area in which the head unit performs the operation on the second mounting target having a three-dimensional shape as compared with the first mounting target are provided. Accordingly, the operation can be performed on the first mounting target having a flat plate shape (having a simple shape) in the first mounting target work area of the mounting target working device, and the operation can be performed on the second mounting target having a three-dimensional shape (having a complicated shape) as compared with the first mounting target in the second mounting target work area of the same mounting target working device. Consequently, in one mounting target working device, the operation can be performed on both the first mounting target having a simple shape and the second mounting target having a complicated shape. In addition, the operation can be performed on both the first mounting target having a simple shape and the second mounting target having a complicated shape by the same head unit, and thus even when the operation is performed on both the first mounting target having a simple shape and the second mounting target having a complicated shape in one mounting target working device, the complexity of the device structure can be significantly reduced or prevented.

The aforementioned mounting target working device according to this aspect preferably further includes a first mounting target holder that holds the first mounting target when the head unit performs the operation on the first mounting target in the first mounting target work area, and a second mounting target holder that holds the second mounting target and moves the held second mounting target along an upward-downward direction, or rotates or inclines the held second mounting target when the head unit performs the operation on the second mounting target in the second mounting target work area. The first mounting target work area is preferably an area in which the first mounting target holder is disposed, and the second mounting target work area is preferably an area in which the second mounting target holder is disposed. According to this structure, the first mounting target is held by the first mounting target holder such that the operation on the first mounting target can be stably performed in the first mounting target work area. In addition, the second mounting target is held by the second mounting target holder such that the operation on the second mounting target can be stably performed in the second mounting target work area. Moreover, the second mounting target holder moves the second mounting target along the upward-downward direction, or rotates or inclines the second mounting target such that the operation can be easily performed even on the second mounting target having a complicated shape (three-dimensional shape).

In such a case, the first mounting target work area and the second mounting target work area are preferably disposed at different positions from each other. According to this structure, the first mounting target holder disposed in the first mounting target work area and the second mounting target holder disposed in the second mounting target work area can be disposed at different positions from each other. Consequently, as compared with the case in which the first mounting target holder and the second mounting target holder are disposed at the same position, a space in which the first mounting target holder is disposed and a space in which the second mounting target holder is disposed can be easily ensured.

The aforementioned structure in which the first mounting target work area and the second mounting target work area are disposed at the different positions from each other preferably further includes a conveyance unit including a conveyance path through which the first mounting target and the second mounting target are carried in, conveyed, and carried out, and the first mounting target work area is preferably disposed in the conveyance path. According to this structure, unlike the case in which the first mounting target work area is disposed outside the conveyance path, the conveyance unit only conveys the first mounting target along the conveyance path such that the first mounting target can be disposed in the first mounting target work area.

Consequently, the time taken between when the first mounting target is carried into the device and when the first mounting target is disposed in the first mounting target work area can be shortened. This effect is particularly effective when the first mounting target throughput is higher than the second mounting target throughput.

In such a case, the second mounting target work area is preferably disposed outside the conveyance path. According to this structure, the second mounting target holder can be disposed outside the conveyance path in which the first mounting target holder is disposed, and thus the space in which the second mounting target holder is disposed can be easily ensured outside the conveyance path. In addition, the second mounting target holder is not disposed in the conveyance path such that the arrangement space in the conveyance path can be increased in size, and thus the space in which the first mounting target holder is disposed can be easily ensured in the conveyance path.

The aforementioned structure in which the second mounting target work area is disposed outside the conveyance path preferably further includes a transfer unit that receives the second mounting target from the conveyance unit and transfers the second mounting target to the second mounting target work area. According to this structure, even when the second mounting target work area is disposed outside the conveyance path, the second mounting target carried into the device by the conveyance unit can be easily moved to the second mounting target work area by the transfer unit.

In the aforementioned structure including the transfer unit, the transfer unit preferably includes a first transfer portion disposed in the conveyance path and that is movable in the upward-downward direction and receives the second mounting target from the conveyance unit, and a second transfer portion disposed outside the conveyance path and that receives the second mounting target from the first transfer portion and transfers the second mounting target to the second mounting target work area, and the first transfer portion, the second transfer portion, and the second mounting target work area are preferably disposed side by side in a direction orthogonal to a conveyance direction in the conveyance path. According to this structure, the second mounting target can be transferred from the conveyance unit to the second mounting target work area by the first transfer portion and the second transfer portion so as to avoid the conveyance unit. In addition, the first transfer portion, the second transfer portion, and the second mounting target work area are disposed side by side in the direction orthogonal to the conveyance direction in the conveyance path such that a distance from the conveyance unit to the second mounting target work area can be shortened, and thus the time required to transfer the second mounting target from the conveyance unit to the second mounting target work area can be shortened.

In the aforementioned structure in which the transfer unit includes the first transfer portion and the second transfer portion, the first transfer portion is preferably disposed at a different position from that of the first mounting target work area in the conveyance path. According to this structure, even in the conveyance path having a small arrangement space, spaces in which the first mounting target holder and the first transfer portion of the transfer unit are disposed can be easily ensured in the conveyance path.

In the aforementioned structure in which the transfer unit includes the first transfer portion and the second transfer portion, the first transfer portion is preferably disposed in the first mounting target work area of the conveyance path. According to this structure, as compared with the case in which the first transfer portion of the transfer unit and the first mounting target work area are disposed at different positions in the conveyance path, the conveyance path can be shortened, and thus the mounting target working device can be miniaturized accordingly.

In such a case, the first mounting target holder preferably includes a mounting target fixing unit that fixes the first mounting target when the head unit performs the operation on the first mounting target in the first mounting target work area, and in a state in which the mounting target fixing unit is retracted, the first transfer portion of the transfer unit preferably receives the second mounting target from the conveyance unit. According to this structure, when the first transfer portion of the transfer unit receives the second mounting target from the conveyance unit, the mounting target fixing unit of the first mounting target holder can be prevented from hindering the transfer operation.

In the aforementioned structure in which the transfer unit includes the first transfer portion and the second transfer portion, after the head unit performs the operation on the second mounting target, the second transfer portion preferably receives the second mounting target, the second transfer portion preferably delivers the second mounting target to the first transfer portion, and the first transfer portion preferably delivers the second mounting target to the conveyance unit. According to this structure, the second mounting target can be easily transferred from the second mounting target work area to the conveyance unit by the first transfer portion and the second transfer portion of the transfer unit.

In the aforementioned structure in which the first mounting target work area is disposed in the conveyance path, the second mounting target work area is preferably disposed in the conveyance path. According to this structure, unlike the case in which the second mounting target work area is disposed outside the conveyance path, it is not necessary to provide a device that transfers the second mounting target from the conveyance path to the second mounting target work area disposed outside the conveyance path. Consequently, the structure of the mounting target working device can be simplified. Furthermore, it is not necessary to transfer the second mounting target from the conveyance path to the second mounting target work area disposed outside the conveyance path, and thus as compared with the case in which the second mounting target work area is disposed outside the conveyance path, the time taken between when the second mounting target is carried into the device and when the second mounting target is disposed in the second mounting target work area can be shortened.

According to the present disclosure, as described above, it is possible to provide a mounting target working device capable of performing work on both a mounting target having a simple shape and a mounting target having a complicated shape.

BRIEF DESCRIPTION OF THE DRAWINGS

FIG. 10 is a diagram illustrating step S4 of the mounting processing according to the first embodiment, in which Section (A) is a schematic plan view of the mounting target working device, and Section (B) is a diagram showing the transfer unit as viewed in the conveyance direction;

FIG. 11 is a diagram illustrating step S6 of the mounting processing according to the first embodiment;

FIG. 14 is a diagram illustrating step S10 of the mounting processing according to the first embodiment, in which Section (A) is a schematic plan view of the mounting target working device, and Section (B) is a diagram showing the first mounting target holder as viewed in the conveyance direction;

FIG. 15 is a diagram showing the overall structure of a mounting target working device according to a second embodiment;

DETAILED DESCRIPTION

Embodiments embodying the present disclosure are hereinafter described on the basis of the drawings. In the following description, a conveyance direction in a conveyance path 5a is defined as an X direction, a direction orthogonal to the X direction in a horizontal plane is defined as a Y direction, and an upward-downward direction orthogonal to the horizontal plane is defined as a Z direction. Furthermore, the upstream side in the conveyance direction is defined as the X1 direction side, and the downstream side in the conveyance direction is defined as the X2 direction side.

First Embodiment (Structure of Mounting Target Working Device)

The structure of a mounting target working device 100 according to a first embodiment of the present disclosure is now described with reference to FIGS. 1 to 6.

Figure 1:
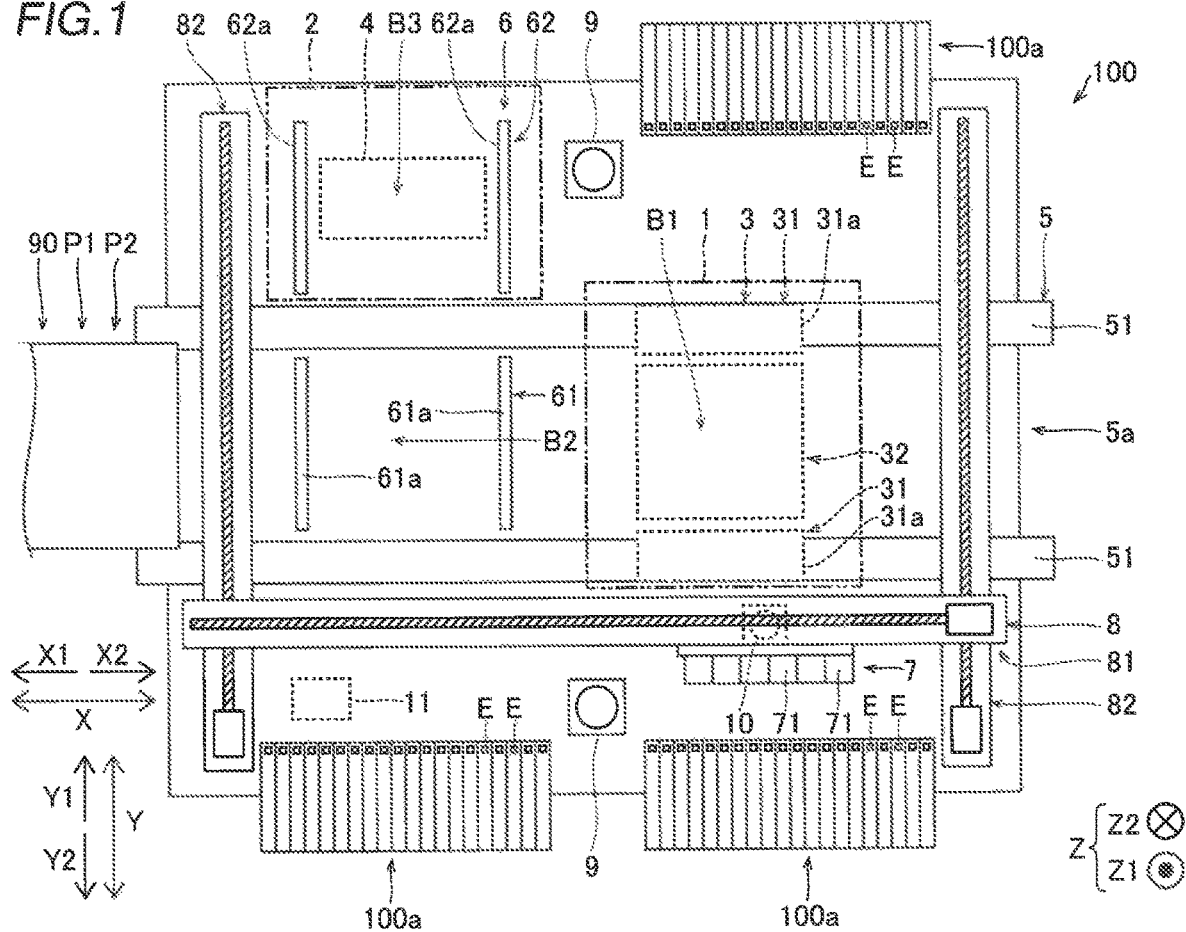
FIG. 1 is diagram showing the overall structure of a mounting target working device according to a first embodiment.

In the first embodiment, as shown in FIG. 1, the mounting target working device 100 includes a first mounting target work area 1 (indicated by a two-dot chain line) in which an operation for mounting components E is performed by a head unit 7 described below on a first mounting target P1 (see FIG. 2) having a flat plate shape, and a second mounting target work area 2 (indicated by a two-dot chain line) in which the operation for mounting the components E is performed by the head unit 7 on a second mounting target P2 (see FIG. 3) having a three-dimensional shape as compared with the first mounting target P1. That is, the mounting target working device 100 is a component mounter capable of performing a mounting operation on both the first mounting target P1 having a simple shape and the second mounting target P2 having a complicated shape. The mounting target working device 100 is a surface mounter that mounts the components E on a bonding member such as a solder disposed on the first mounting target P1 or the second mounting target P2. Furthermore, the components E are electronic components such as ICs, transistors, capacitors, and resistors.

In the mounting target working device 100, the first mounting target work area 1 and the second mounting target work area 2 are disposed at different positions from each other. Specifically, the first mounting target work area 1 and the second mounting target work area 2 are disposed at positions that do not overlap each other in a plan view (as viewed in the Z direction).

Figure 2:
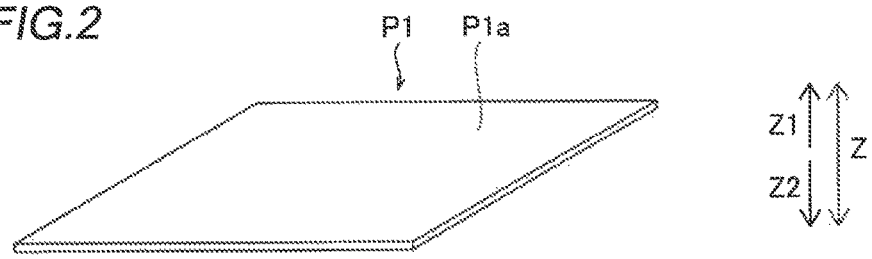
FIG. 2 is a perspective view showing a first mounting target having a simple shape

As shown in FIG. 2, the first mounting target P1 is, for example, a single-sided mounting target having only one mounting target surface P1a. In addition, the first mounting target P1 may be, for example, a double-sided mounting target having two mounting target surfaces P1a: one mounting target surface P1a and a mounting target surface P1a opposite to the one mounting target surface P1a.

Figure 3:
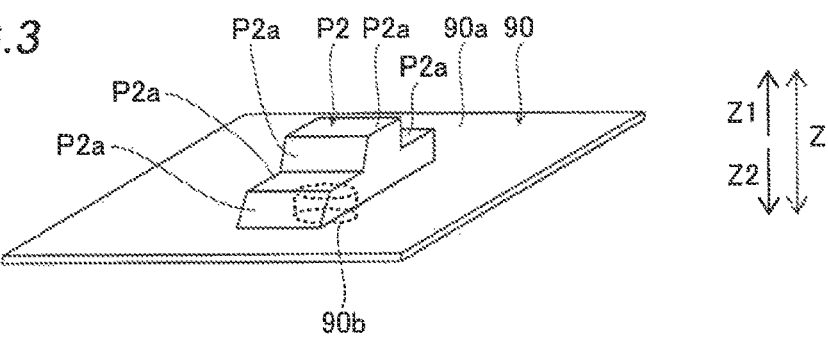
FIG. 3 is a perspective view showing a second mounting target having a complicated shape.

The second mounting target P2 may have any shape, and may have any number of mounting target surfaces P2a. In FIG. 3, as an example of the second mounting target P2, a second mounting target P2 having a plurality of mounting target surfaces P2a including mounting target surfaces P2a that intersect with each other is illustrated. In addition, the second mounting target P2 is not restricted to the example shown in FIG. 3, but the second mounting target P2 may not have the mounting target surfaces P2a that intersect with each other.

As shown in FIG. 3, in the mounting target working device 100, the second mounting target P2 is placed on a placement member 90 for conveyance. The second mounting target P2 is conveyed in a state in which the same is placed on the placement member 90. The placement member 90 includes a placement portion 90a on which the second mounting target P2 is placed and a held portion 90b provided at a lower portion of the placement portion 90a and held by a second mounting target holder 4 described below. Although the rectangular placement member 90 is illustrated in FIG. 3, the placement member 90 may have any shape as long as the same can be conveyed.

The mounting target working device 100 includes a first mounting target holder 3, the second mounting target holder 4, a conveyance unit 5, a transfer unit 6, the head unit 7, and a head movement mechanism 8, component imagers 9, a mark imager 10, and a controller 11. In the first embodiment, the first mounting target work area 1 is an area in which the first mounting target holder 3 is disposed, and the second mounting target work area 2 is an area in which the second mounting target holder 4 is disposed.

Figure 4:
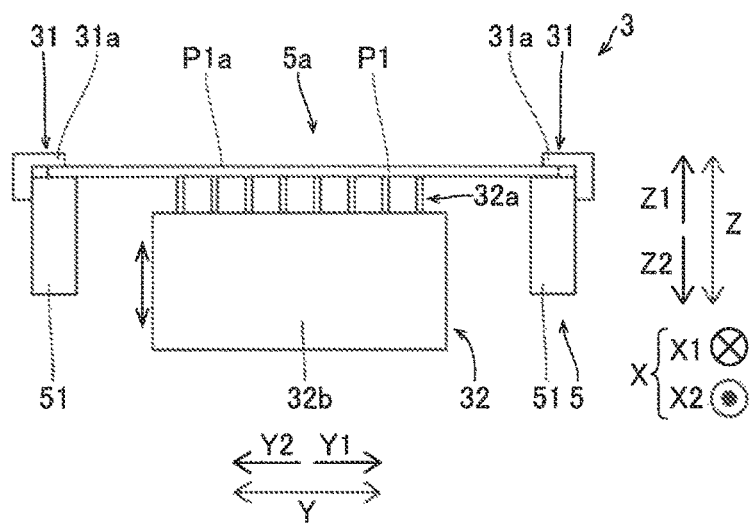
FIG. 4 is a diagram showing a first mounting target holder of the mounting target working device as viewed in a conveyance direction.

The first mounting target holder 3 holds the first mounting target P1 when the head unit 7 performs the mounting operation on the first mounting target P1 in the first mounting target work area 1. Specifically, as shown in FIG. 4, the first mounting target holder 3 includes a mounting target fixing unit 31 and a mounting target support 32.

The mounting target fixing unit 31 is a clamp mechanism that fixes the first mounting target P1 when the head unit 7 performs the mounting operation on the first mounting target P1 in the first mounting target work area 1. The mounting target fixing unit 31 includes a pair of clamps 31a spaced apart from each other in the Y direction, and fixes both ends of the first mounting target P1 in the Y direction by the pair of clamps 31a. Furthermore, the pair of clamps 31a of the mounting target fixing unit 31 are movable between retracted positions at which the first mounting target P1 is not fixed and fixing positions at which the first mounting target P1 is fixed. The pair of clamps 31a are located at the retracted positions when the first mounting target P1 or the second mounting target P2 is conveyed, and are located at the fixing positions when the first mounting target P1 is fixed.

The mounting target support 32 is a backup unit that supports the first mounting target P1 from below (Z2 direction side) when the head unit 7 performs the mounting operation on the first mounting target P1 in the first mounting target work area 1. The mounting target support 32 includes a plurality of backup pins 32a and a backup pin arrangement portion 32b in which the plurality of backup pins 32a are disposed, and supports a lower portion of the first mounting target P1 from below by the plurality of backup pins 32a. Furthermore, the plurality of backup pins 32a and the backup pin arrangement portion 32b of the mounting target support 32 are movable along the upward-downward direction (Z direction) between retracted positions at which the first the first object P1 is not supported and support positions at which the first mounting target P1 is supported. The plurality of backup pins 32a and the backup pin arrangement portion 32b are located at the retracted positions when the first mounting target P1 or the second mounting target P2 is conveyed, and are located at the support positions when the first mounting target P1 is supported.

As shown in FIG. 1, when the head unit 7 performs the mounting operation on the second mounting target P2 in the second mounting target work area 2, the second mounting target holder 4 holds the second mounting target P2 via the placement member 90. The second mounting target holder 4 moves the held second mounting target P2 along the upward-downward direction (Z direction), or rotates or inclines the held second mounting target P2.

Figure 5:
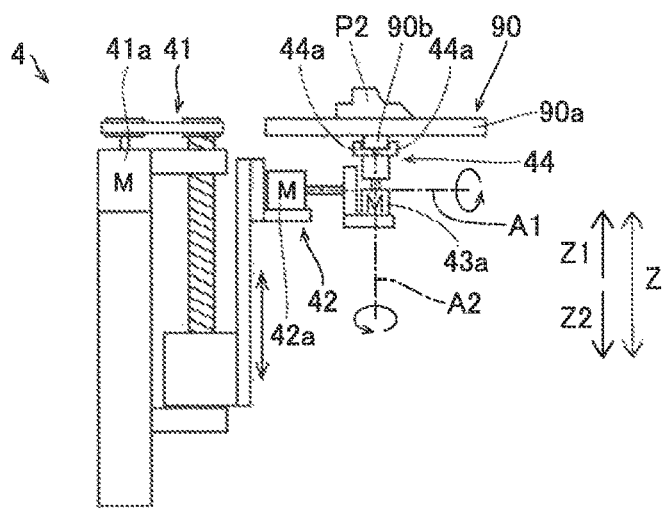
FIG. 5 is a diagram showing a second mounting target holder of the mounting target working device.

Specifically, as shown in FIG. 5, the second mounting target holder 4 includes an elevation mechanism 41, an inclination mechanism 42, a rotation mechanism 43, and a holder 44. In the second mounting target holder 4, the holder 44 is attached to the rotation mechanism 43, the rotation mechanism 43 is attached to the inclination mechanism 42, and the inclination mechanism 42 is attached to the elevation mechanism 41.

The elevation mechanism 41 includes a drive motor 41a, and moves the second mounting target P2 held by the holder 44 along the upward-downward direction (Z direction) by the drive force of the drive motor 41a. The inclination mechanism 42 includes a drive motor 42a, and rotates the second mounting target P2 held by the holder 44 about a rotation axis A1 that extends along a horizontal direction by the drive force of the drive motor 42a. Thus, the inclination mechanism 42 inclines the second mounting target P2 held by the holder 44. The rotation mechanism 43 includes a drive motor 43a, and rotates the second mounting target P2 held by the holder 44 about a rotation axis A2 that extends in a direction substantially orthogonal to the rotation axis A1 by the drive force of the drive motor 43a. The holder 44 holds the second mounting target P2 via the placement member 90. Specifically, the holder 44 includes a plurality of claws 44a, and holds and fixes the held portion 90b of the placement member 90 by the plurality of claws 44a.

As shown in FIG. 1, the conveyance unit 5 includes a single conveyance path 5a through which the first mounting target P1 and the second mounting target P2 are carried in, conveyed, and carried out. In the first embodiment, the first mounting target work area 1 (first mounting target holder 3) is disposed in the conveyance path 5a. In addition, the second mounting target work area 2 (second mounting target holder 4) is disposed outside the conveyance path 5a.

The conveyance unit 5 includes a pair of conveyors 51 spaced apart from each other in the Y direction. Each of the pair of conveyors 51 includes a conveyor belt. The conveyance unit 5 conveys an object to be conveyed (the placement member 90 on which the first mounting target P1 or the second mounting target P2 is placed) along the conveyance path 5a that extends in the X direction while supporting, from below, both ends of the object to be conveyed in the Y direction by the pair of conveyors 51.

Specifically, when carrying in the first mounting target P1, the conveyance unit 5 conveys the first mounting target P1 carried in to the downstream side (X2 direction side) and stops the first mounting target P1 at a mounting stop position B1. The mounting stop position B1 is a position at which the first mounting target P1 is stopped in order for the head unit 7 to perform the mounting operation, and a position at which the first mounting target holder 3 is disposed in the first mounting target work area 1. Then, after the head unit 7 performs the mounting operation in the first mounting target work area 1, the conveyance unit 5 conveys the first mounting target P1 in an X2 direction from the mounting stop position B1 and carries out the first mounting target P1.

When carrying in the second mounting target P2, the conveyance unit 5 conveys the carried-in second mounting target P2 to the downstream side (X2 direction side) and stops it at a transfer stop position B2. The transfer stop position B2 is a position at which the second mounting target P2 is stopped in order for the transfer unit 6 to perform transfer, and a position at which a first transfer portion 61 of the transfer unit 6 described below is disposed in the conveyance path 5a. The second mounting target P2 stopped at the transfer stop position B2 is transferred to the second mounting target work area 2 by the transfer unit 6. Then, after the head unit 7 performs the mounting operation in the second mounting target work area 2, the second mounting target P2 is transferred (returned) to the transfer stop position B2 by the transfer unit 6. Then, the conveyance unit 5 conveys the first mounting target P1 in the X2 direction from the transfer stop position B2 and carries out the same.

The transfer unit 6 is a device provided separately from and independently of the conveyance unit 5, receives the second mounting target P2 (placement member 90) from the conveyance unit 5, and transfers the second mounting target P2 to the second mounting target work area 2. Specifically, the transfer unit 6 includes the first transfer portion 61 disposed at the transfer stop position B2 in the conveyance path 5a and a second transfer portion 62 disposed outside the conveyance path 5a. The first transfer portion 61 is disposed at a different position from that of the first mounting target work area 1 (first mounting target holder 3) in the conveyance path 5a. In the first embodiment, the first transfer portion 61, the second transfer portion 62, and the second mounting target work area 2 (second mounting target holder 4) are disposed side by side in the Y direction in this order from the Y2 direction side.

Figure 6:
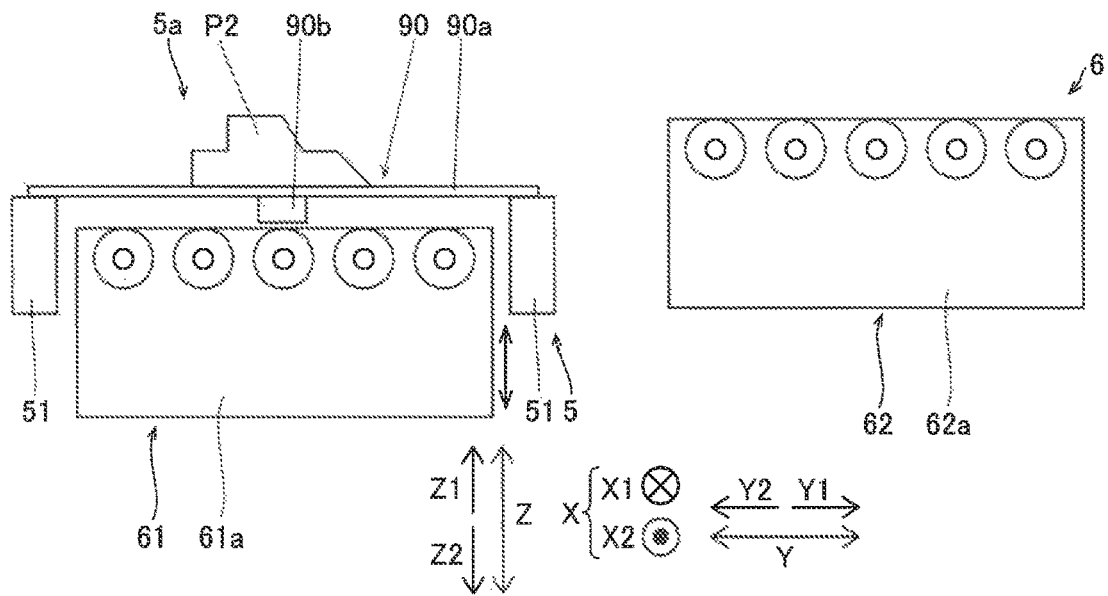
FIG. 6 is a diagram showing a transfer unit of the mounting target working device as viewed in the conveyance direction.

As shown in FIG. 6, the first transfer portion 61 receives the second mounting target P2 (placement member 90) from the conveyance unit 5. Specifically, the first transfer portion 61 is movable along the upward-downward direction (Z direction) in order to receive the second mounting target P2 (placement member 90) from the conveyance unit 5. More specifically, the first transfer portion 61 is movable along the upward-downward direction (Z direction) between a delivery position (see FIG. 8) at which the first transfer portion 61 delivers the second mounting target P2 to the second transfer portion 62 and a retracted position at which the first transfer portion 61 does not contact the object to be conveyed during conveyance. The first transfer portion 61 is located at the retracted position when the first mounting target P1 or the second mounting target P2 is conveyed, and is located at the delivery position when the first mounting target P1 is delivered. In addition, the first transfer portion 61 moves upward (Z1 direction) from the retracted position to the delivery position and lifts the second mounting target P2 (placement member 90) supported by the pair of conveyors 51 of the conveyance unit 5 to receive the second mounting target P2 (placement member 90) from the conveyance unit 5.

The first transfer portion 61 delivers the received second mounting target P2 (placement member 90) to the second transfer portion 62. Specifically, the first transfer portion 61 conveys the second mounting target P2 (placement member 90) along the Y direction in order to deliver the received second mounting target P2 (placement member 90) to the second transfer portion 62. More specifically, the first transfer portion 61 includes a pair of conveyors 61a (see FIG. 1) spaced apart from each other in the X direction. Each of the pair of conveyors 61a includes a conveyor roller. Each of the pair of conveyors 61a is not restricted to the conveyor roller, but each of the pair of conveyors 61a may include a conveyor belt. The first transfer portion 61 conveys the second mounting target P2 (placement member 90) along the Y direction while supporting both ends of the placement member 90, on which the second mounting target P2 is placed, in the X direction from below by the pair of conveyors 61a. Thus, the first transfer portion 61 disposed at the delivery position passes over (Z1 direction) the conveyance unit 5 and delivers the second mounting target P2 (placement member 90) to the second transfer portion 62. The second transfer portion 62 is disposed at substantially the same height as the first transfer portion 61 disposed at the delivery position.

The second transfer portion 62 receives the second mounting target P2 (placement member 90) from the first transfer portion 61, and transfers the second mounting target P2 (placement member 90) to the second mounting target work area 2. Specifically, the second transfer portion 62 includes a pair of conveyors 62a (see FIG. 1) spaced apart from each other in the X direction. Each of the pair of conveyors 62a includes a conveyor roller. Each of the pair of conveyors 62a is not restricted to the conveyor roller, but each of the pair of conveyors 62a may include a conveyor belt. The second transfer portion 62 conveys the second mounting target P2 (placement member 90) along the Y direction while supporting both ends of the placement member 90, on which the second mounting target P2 is placed, in the X direction from below by the pair of conveyors 62a. Specifically, the second transfer portion 62 conveys the second mounting target P2 (placement member 90) to a holding stop position B3 (see FIG. 1). The holding stop position B3 is a position at which the second mounting target P2 (placement member 90) is stopped in order for the second mounting target holder 4 to perform holding, and a position at which the second mounting target holder 4 is disposed in the second mounting target work area 2. Thus, the second transfer portion 62 transfers the second mounting target P2 (placement member 90) to the second mounting target work area 2.

The pair of conveyors 62a of the second transfer portion 62 move in the X direction such that a width between the pair of conveyors 62a in the X direction is adjustable. Thus, when the second mounting target P2 (placement member 90) held by the second mounting target holder 4 is rotated or inclined, the pair of conveyors 62a can be retracted to positions at which the pair of conveyors 62a do not contact the rotated or inclined second mounting target P2 (placement member 90). In addition, when the placement member 90 having a different width in the X direction is transferred, the width between the pair of conveyors 62a in the X direction can be adjusted according to the width of the placement member 90 in the X direction. When the placement member 90 having a different width in the X direction is transferred, the pair of conveyors 61a of the first transfer portion 61 may be configured such that a width between the pair of conveyors 61a in the X direction is adjustable, similarly to the pair of conveyors 62a of the second transfer portion 62.

The second transfer portion 62 receives the second mounting target P2 from the second mounting target holder 4 after the head unit 7 performs the mounting operation in the second mounting target work area 2, and delivers the second mounting target P2 to the first transfer portion 61. The first transfer portion 61 delivers the second mounting target P2 received from the second transfer portion 62 to the conveyance unit 5.

The head unit 7 holds the components E by suctioning the components E and mounts the held components E on the first mounting target P1 or the second mounting target P2. In the mounting target working device 100, a plurality of tape feeders 100a that supply the components E to be mounted on the first mounting target P1 or the second mounting target P2 are disposed on both sides (the Y1 side and the Y2 side) in the Y direction. The head unit 7 suctions and holds the components E supplied from the tape feeders 100a. Specifically, the head unit 7 includes a plurality of (six) heads (mounting heads) 71. Each of the plurality of heads 71 is connected to a vacuum generator (not shown), and nozzles (not shown) attached to the tips thereof suction and hold the components E by a negative pressure supplied from the vacuum generator. In addition, the head unit 7 releases the holding (suctioning) of the components E at mounting positions on the first mounting target P1 or the second mounting target P2 to mount the components E on the first mounting target P1 or the second mounting target P2.

The head movement mechanism 8 moves the head unit 7 in the horizontal plane (X-Y plane) above the first mounting target P1 or the second mounting target P2 in the conveyance state. Specifically, the head movement mechanism 8 includes an X-axis movement mechanism 81 and a pair of Y-axis movement mechanisms 82.

The head unit 7 is attached to the X-axis movement mechanism 81, and a ball screw shaft mechanism moves the head unit 7 in the X direction. The X-axis movement mechanism 81 is attached to the pair of Y-axis movement mechanisms 82, and the ball screw shaft mechanism moves the X-axis movement mechanism 81 and the head unit 7 in the Y direction. Thus, the head unit 7 is movable between the tape feeders 100a and the first mounting target P1 disposed in the first mounting target work area 1, and is movable between the tape feeders 100a and the second mounting target P2 disposed in the second mounting target work area 2.

The component imagers 9 are cameras for component recognition that image the components E suctioned by the heads 71 prior to an operation for mounting the components E. The component imagers 9 are fixed to the upper surface of a base of the mounting target working device 100, and image the components E suctioned by the heads 71 from the lower side (Z2 direction side) of the components E. The controller 11 acquires (recognizes) the suction states (the rotational orientations and the suction positions with respect to the heads 71) of the components E based on the images of the components E captured by the component imagers 9.

The mark imager 10 is a camera for mark recognition that images a position recognition mark (not shown) attached to the mounting target (P1 or P2) prior to an operation for mounting the components E. The position recognition mark is a mark for recognizing the position of the mounting target (P1 or P2). The controller 11 acquires (recognizes) the accurate position and orientation of the mounting target (P1 or P2) based on the image of the position recognition mark captured by the mark imager 10. In addition, the mark imager 10 is attached to the head unit 7, and is movable together with the head unit 7 in the horizontal plane (X-Y plane) above the first mounting target P1 or the second mounting target P2 in the conveyance state.

The controller 11 includes a central processing unit (CPU), a read only memory (ROM), a random access memory (RAM), etc., and is a control circuit that controls the operation of the mounting target working device 100. The controller 11 controls the first mounting target holder 3, the second mounting target holder 4, the conveyance unit 5, the transfer unit 6, the head unit 7, the head movement mechanism 8, the component imagers 9, and the mark imager 10 according to a production program to mount the components E on the first mounting target P1 or the second mounting target P2.

(Mounting Processing)

Mounting processing performed by the mounting target working device 100 is now described with reference to FIGS. 7 to 14 based on a flowchart. Each step in the flowchart is performed by the controller 11.

Figure 7:
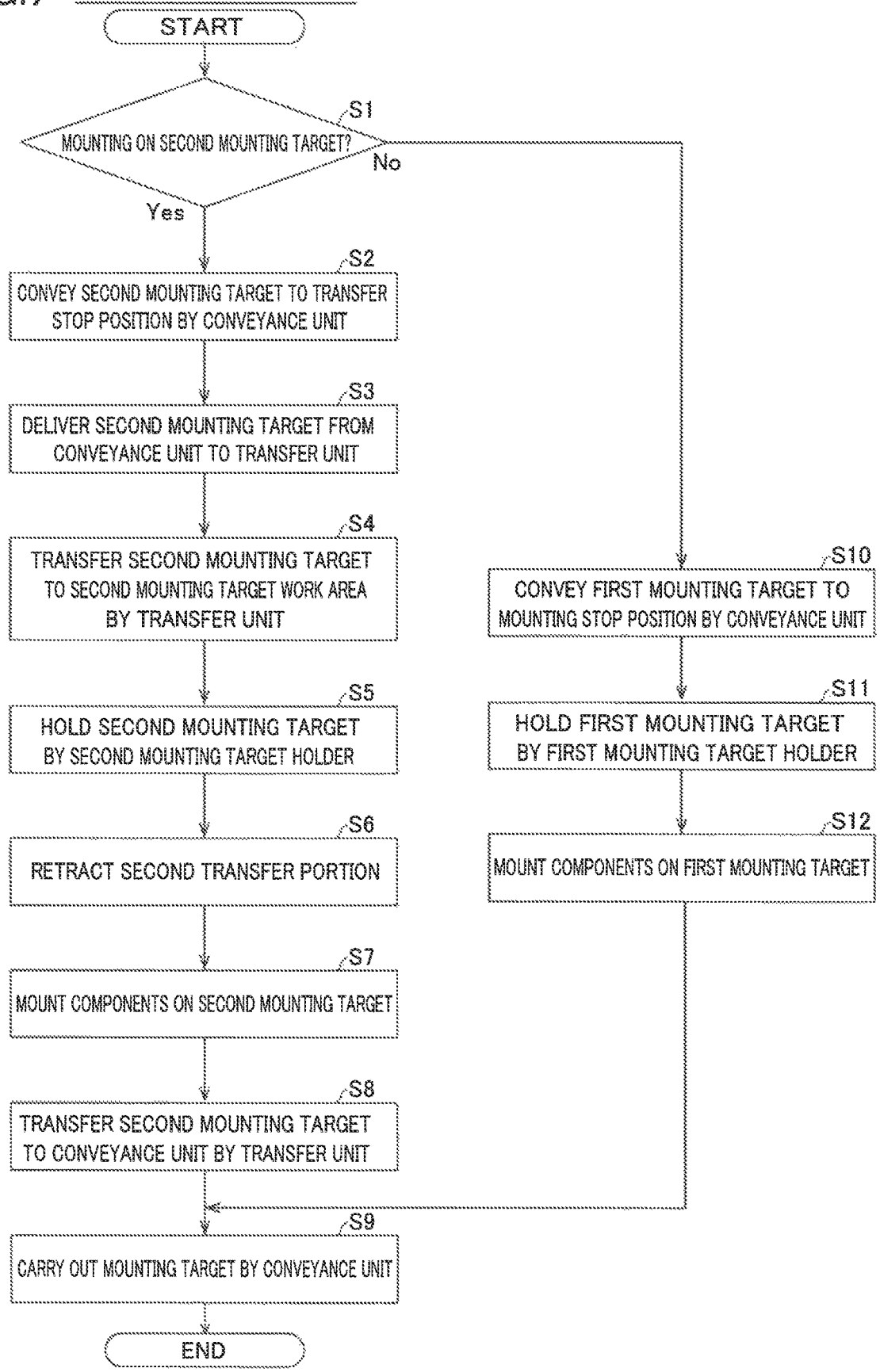
FIG. 7 is a flowchart illustrating mounting processing by the mounting target working device according to the first embodiment

As shown in FIG. 7, first, in step S1, it is determined whether or not the mounting operation is performed on the second mounting target P2. When it is determined that the mounting operation is performed on the second mounting target P2, the processing advances to step S2. Then, in step S2 to step S9, carrying-in of the second mounting target P2, mounting on the second mounting target P2, and carrying-out of the second mounting target P2 are performed. When it is determined that the mounting operation is not performed on the second mounting target P2 (the mounting operation is performed on the first mounting target P1), the processing advances to step S10. Then, in step S10 to step S12 and step S9, carrying-in of the second mounting target P2, mounting on the second mounting target P2, and carrying-out of the second mounting target P2 are performed. The carrying-in of the second mounting target P2, the mounting on the second mounting target P2, and the carrying-out of the second mounting target P2 in step S2 to step S9 are now described.

Figure 8:
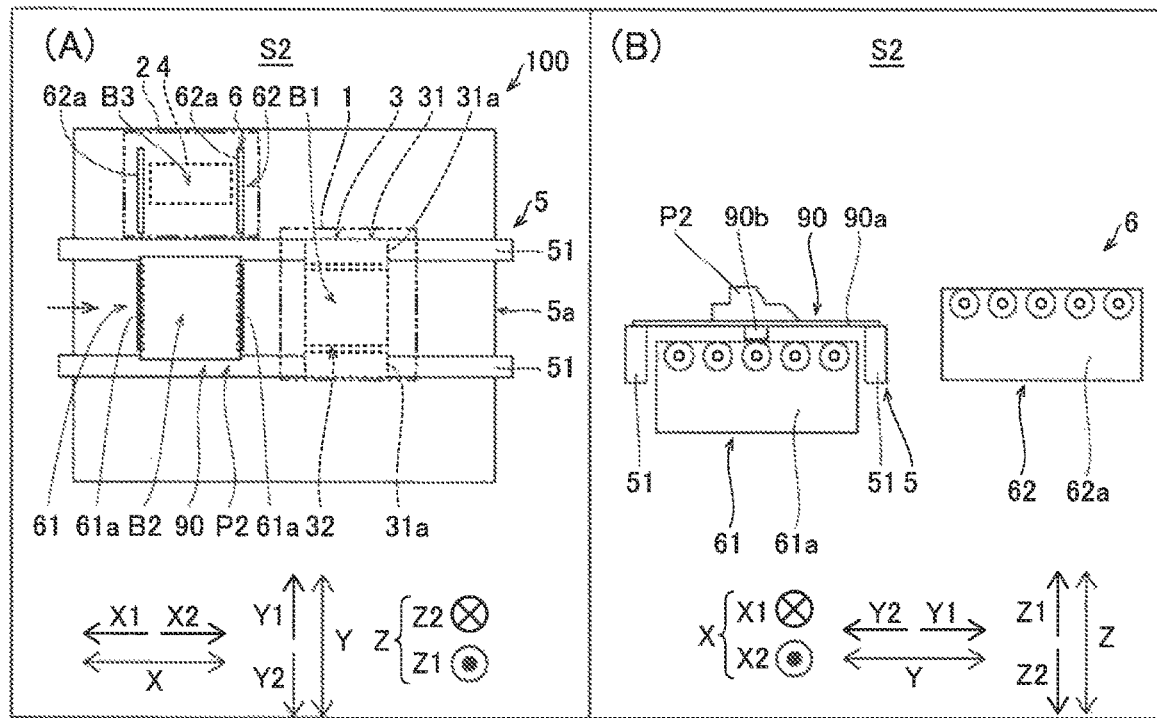
FIG. 8 is diagram illustrating step S2 of the mounting processing according to the first embodiment, in which Section (A) is a schematic plan view of the mounting target working device, and Section (B) is a diagram showing the transfer unit as viewed in the conveyance direction.

First, in step S2, as shown in Sections (A) and (B) of FIG. 8, the second mounting target P2 placed on the placement member 90 is carried in from the outside of the device by the conveyance unit 5, and is conveyed to the transfer stop position B2.

Figure 9:
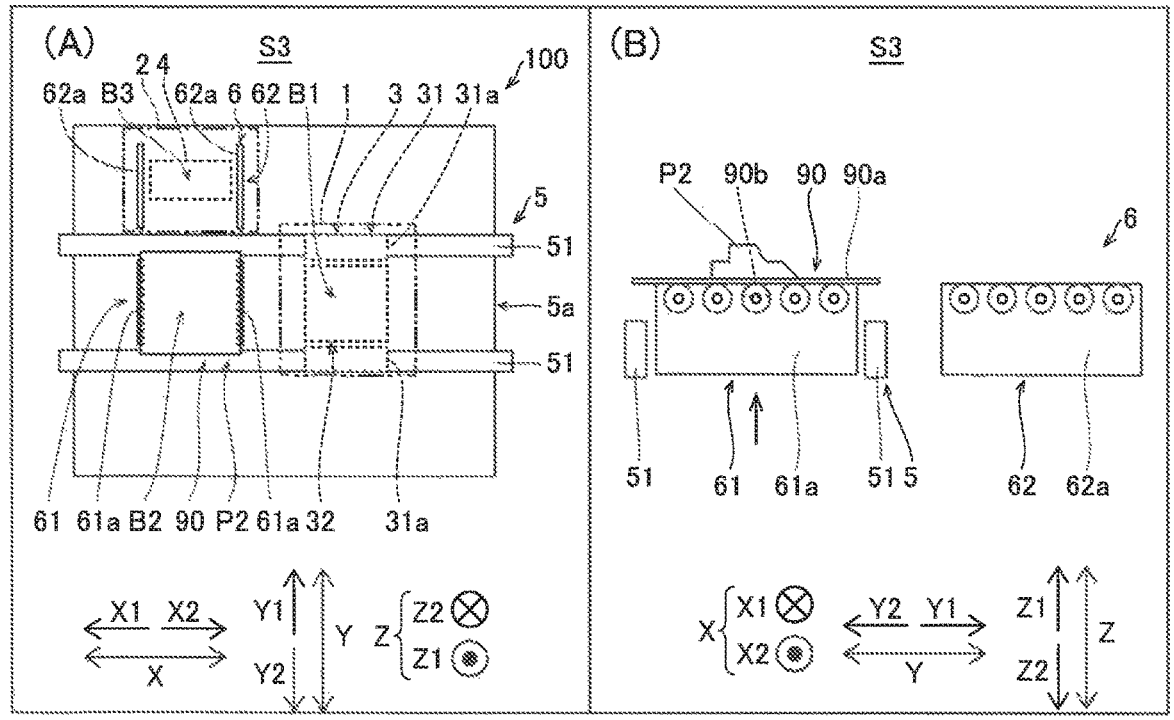
FIG. 9 is a diagram illustrating step S3 of the mounting processing according to the first embodiment, in which Section (A) is a schematic plan view of the mounting target working device, and Section (B) is a diagram showing the transfer unit as viewed in the conveyance direction.

Next, in step S3, as shown in Sections (A) and (B) of FIG. 9, the second mounting target P2 (placement member 90) is delivered from the conveyance unit 5 to the first transfer portion 61 of the transfer unit 6. In step S3, the first transfer portion 61 moves upward (Z1 direction) from the retracted position to the delivery position such that the second mounting target P2 (placement member 90) is delivered from the conveyance unit 5 to the first transfer portion 61. Then, in step S3, the second mounting target P2 (placement member 90) is conveyed along the Y direction by the first transfer portion 61 so as to pass over the conveyance unit 5, and is delivered from the first transfer portion 61 to the second transfer portion 62.

Next, in step S4, as shown in Sections (A) and (B) of FIG. 10, the second mounting target P2 (placement member 90) is conveyed to the holding stop position B3 by the second transfer portion 62 of the transfer unit 6. Thus, in step S4, the second mounting target P2 (placement member 90) is transferred to the second mounting target work area 2.

Next, in step S5, the second mounting target P2 (the held portion 90b of the placement member 90) is held at the holding stop position B3 by the holder 44 of the second mounting target holder 4.

Next, in step S6, as shown in FIG. 11, the pair of conveyors 62a of the second transfer portion 62 are moved in the X direction so as to be spaced apart from each other. Thus, in step S6, the pair of conveyors 62a of the second transfer portion 62 are retracted.

Next, in step S7, the components E are mounted, by the head unit 7, on the mounting target surfaces P2a of the second mounting target P2 held by the holder 44 of the second mounting target holder 4. In step S7, the second mounting target P2 is moved along the upward-downward direction, or is rotated or inclined by the second mounting target holder 4 such that the orientations and the positions of the mounting target surfaces P2a of the second mounting target P2 enable the head unit 7 to perform mounting. For example, the second mounting target P2 is rotated or inclined such that the mounting target surfaces P2a of the second mounting target P2 are substantially parallel to the horizontal plane. In addition, for example, the second mounting target P2 is moved along the upward-downward direction such that the mounting target surfaces P2a of the second mounting target P2 are located at heights at which the head unit 7 can perform mounting. When the mounting operation on the second mounting target P2 in the second mounting target work area 2 is completed, the second mounting target P2 (placement member 90) is disposed, by the second mounting target holder 4, at a predetermined position at which the second mounting target P2 can be received by the second transfer portion 62. Then, the pair of conveyors 62a of the second transfer portion 62 are moved in the X direction so as to be closer to each other such that the second mounting target P2 (placement member 90) disposed at a predetermined position is received by the pair of conveyors 62a of the second transfer portion 62.

Figure 12:
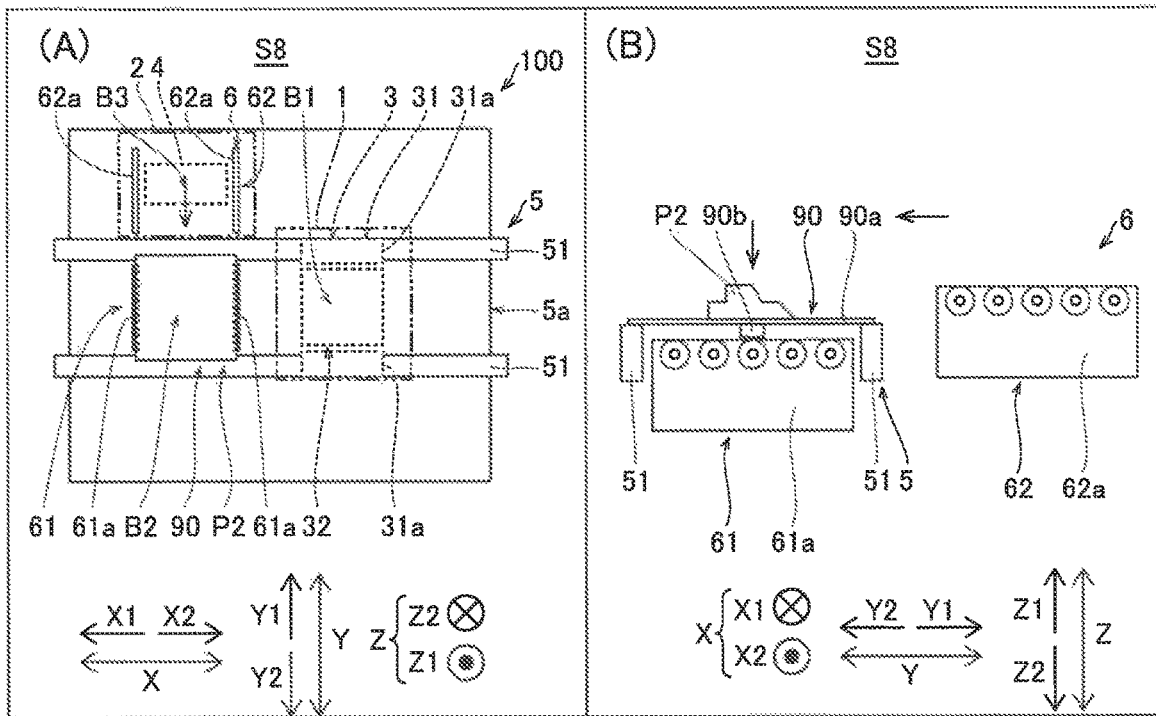
FIG. 12 is a diagram illustrating step S8 of the mounting processing according to the first embodiment, in which Section (A) is a schematic plan view of the mounting target working device, and Section (B) is a diagram showing the transfer unit as viewed in the conveyance direction.
Figure 13:
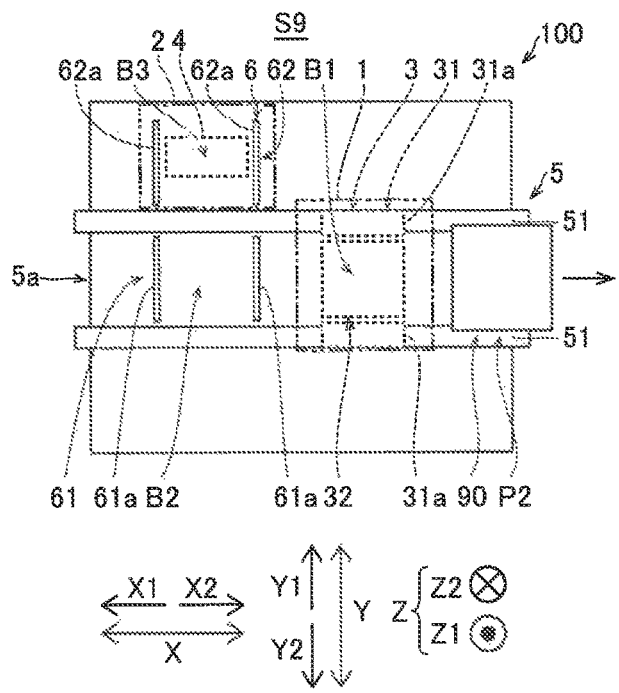
FIG. 13 is a diagram illustrating step S9 of the mounting processing according to the first embodiment.

Next, in step S8, as shown in Sections (a) and (B) of FIG. 12, the second mounting target P2 (placement member 90) is transferred to the conveyance unit 5 by the first transfer portion 61 and the second transfer portion 62 of the transfer unit 6. In step S8, first, the second mounting target P2 (placement member 90) is transferred along the Y direction by the second transfer portion 62 so as to be delivered from the second transfer portion 62 to the first transfer portion 61. Next, the second mounting target P2 is transferred along the Y direction by the first transfer portion 61, and the first transfer portion 61 is moved downward (Z2 direction) from the delivery position to the retracted position such that the second mounting target P2 (placement member 90) is delivered from the first transfer portion 61 to the conveyance unit 5. Consequently, the second mounting target P2 (placement member 90) is transferred from the second mounting target work area 2 to the conveyance unit 5. The transferred second mounting target P2 is disposed at the transfer stop position B2.

Next, in step S9, the second mounting target P2 disposed at the transfer stop position B2 is transferred along the X direction by the conveyance unit 5, and is carried out. Then, the processing of mounting on the second mounting target P2 is terminated.

The carrying-in of the first mounting target P1, the mounting on the first mounting target P1, and the carrying-out of the first mounting target P1 in step S10 to step 12 and step S9 are now described.

First, in step S10, as shown in Sections (A) and (B) of FIG. 14, the first mounting target P1 is carried in from the outside of the device by the conveyance unit 5, and is conveyed to the mounting stop position B1.

Next, in step S11, the first mounting target P1 disposed at the mounting stop position B1 is held by the mounting target fixing unit 31 and the mounting target support 32 of the first mounting target holder 3. In step S11, the mounting target fixing unit 31 is moved from the retracted position to the fixing position such that both ends of the first mounting target P1 in the Y direction are fixed by the pair of clamps 31a of the mounting target fixing unit 31. In step S11, the mounting target support 32 is moved upward from the retracted position to the support position such that the lower portion of the first mounting target P1 is supported from below by the plurality of backup pins 32a of the mounting target support 32.

Next, in step S12, the head unit 7 mounts the components E on the mounting target surface P1a of the first mounting target P1 held by the mounting target fixing unit 31 and the mounting target support 32 of the first mounting target holder 3. In step S12, in a state in which the first mounting target P1 is fixed at the mounting stop position B1, the components E are mounted on the mounting target surface P1a of the first mounting target P1 substantially parallel to the horizontal plane.

Next, in step S9, the first mounting target P1 disposed at the mounting stop position B1 is conveyed along the X direction by the conveyance unit 5, and is carried out. Then, the processing of mounting on the first mounting target P1 is terminated.

Effects of First Embodiment

According to the first embodiment, the following effects are achieved.

According to the first embodiment, as described above, the first mounting target work area 1 and the second mounting target work area 2 are provided. Accordingly, the mounting operation can be performed on the first mounting target P1 having a flat plate shape (having a simple shape) in the first mounting target work area 1 of the mounting target working device 100, and the mounting operation can be performed on the second mounting target P2 having a three-dimensional shape (having a complicated shape) as compared with the first mounting target P1 in the second mounting target work area 2 of the same mounting target working device 100. Consequently, in one mounting target working device 100, the mounting operation can be performed on both the first mounting target P1 having a simple shape and the second mounting target P2 having a complicated shape. In addition, the mounting operation can be performed on both the first mounting target P1 having a simple shape and the second mounting target P2 having a complicated shape by the same head unit 7, and thus even when the mounting operation is performed on both the first mounting target P1 having a simple shape and the second mounting target P2 having a complicated shape in one mounting target working device 100, the complexity of the device structure can be significantly reduced or prevented.

According to the first embodiment, as described above, the mounting target working device 100 includes the first mounting target holder 3 that holds the first mounting target P1 when the mounting operation is performed on the first mounting target P1 by the head unit 7 in the first mounting target work area 1, and the second mounting target holder 4 that holds the second mounting target P2 and moves the held second mounting target P2 along the upward-downward direction, or rotates or inclines the held second mounting target P2 when the mounting operation is performed on the second mounting target P2 by the head unit 7 in the second mounting target work area 2. Furthermore, the first mounting target work area 1 is the area in which the first mounting target holder 3 is disposed, and the second mounting target work area 2 is the area in which the second mounting target holder 4 is disposed. Accordingly, the first mounting target P1 is held by the first mounting target holder 3 such that the mounting operation on the first mounting target P1 can be stably performed in the first mounting target work area 1. In addition, the second mounting target P2 is held by the second mounting target holder 4 such that the mounting operation on the second mounting target P2 can be stably performed in the second mounting target work area 2. Moreover, the second mounting target holder 4 moves the second mounting target P2 along the upward-downward direction, or rotates or inclines the second mounting target P2 such that the mounting operation can be easily performed even on the second mounting target P2 having a complicated shape (three-dimensional shape).

According to the first embodiment, as described above, the first mounting target work area 1 and the second mounting target work area 2 are disposed at different positions from each other. Accordingly, the first mounting target holder 3 disposed in the first mounting target work area 1 and the second mounting target holder 4 disposed in the second mounting target work area 2 can be disposed at different positions from each other. Consequently, as compared with the case in which the first mounting target holder 3 and the second mounting target holder 4 are disposed at the same position, a space in which the first mounting target holder 3 is disposed and a space in which the second mounting target holder 4 is disposed can be easily ensured.

According to the first embodiment, as described above, the mounting target working device 100 includes the conveyance unit 5 including the conveyance path 5a through which the first mounting target P1 and the second mounting target P2 are carried in, conveyed, and carried out. Furthermore, the first mounting target work area 1 is disposed in the conveyance path 5a. Accordingly, unlike the case in which the first mounting target work area 1 is disposed outside the conveyance path 5a, the conveyance unit 5 only conveys the first mounting target P1 along the conveyance path 5a such that the first mounting target P1 can be disposed in the first mounting target work area 1. Consequently, the time taken between when the first mounting target P1 is carried into the device and when the first mounting target P1 is disposed in the first mounting target work area 1 can be shortened. This effect is particularly effective when the first mounting target P1 throughput is higher than the second mounting target P2 throughput.

According to the first embodiment, as described above, the second mounting target work area 2 is disposed outside the conveyance path 5a. Accordingly, the second mounting target holder 4 can be disposed outside the conveyance path 5a in which the first mounting target holder 3 is disposed, and thus the space in which the second mounting target holder 4 is disposed can be easily ensured outside the conveyance path 5a. In addition, the second mounting target holder 4 is not disposed in the conveyance path 5a such that the arrangement space in the conveyance path 5a can be increased in size, and thus the space in which the first mounting target holder 3 is disposed can be easily ensured in the conveyance path 5a.

According to the first embodiment, as described above, the mounting target working device 100 includes the transfer unit 6 that receives the second mounting target P2 from the conveyance unit 5 and transfers the second mounting target P2 to the second mounting target work area 2. Accordingly, even when the second mounting target work area 2 is disposed outside the conveyance path 5a, the second mounting target P2 carried into the device by the conveyance unit 5 can be easily moved to the second mounting target work area 2 by the transfer unit 6.

According to the first embodiment, as described above, the transfer unit 6 includes the first transfer portion 61 disposed in the conveyance path 5a and that is movable in the upward-downward direction and receives the second mounting target P2 from the conveyance unit 5, and the second transfer portion 62 disposed outside the conveyance path 5a and that receives the second mounting target P2 from the first transfer portion 61 and transfers the second mounting target P2 to the second mounting target work area 2. Furthermore, the first transfer portion 61, the second transfer portion 62, and the second mounting target work area 2 are disposed side by side in a direction orthogonal to the conveyance direction in the conveyance path 5a. Accordingly, the second mounting target P2 can be transferred from the conveyance unit 5 to the second mounting target work area 2 by the first transfer portion 61 and the second transfer portion 62 so as to avoid the conveyance unit 5. In addition, the first transfer portion 61, the second transfer portion 62, and the second mounting target work area 2 are disposed side by side in the direction orthogonal to the conveyance direction in the conveyance path 5a such that a distance from the conveyance unit 5 to the second mounting target work area 2 can be shortened, and thus the time required to transfer the second mounting target P2 from the conveyance unit 5 to the second mounting target work area 2 can be shortened.

According to the first embodiment, as described above, the first transfer portion 61 is disposed at a different position from that of the first mounting target work area 1 in the conveyance path 5a. Accordingly, even in the conveyance path 5a having a small arrangement space, spaces in which the first mounting target holder 3 and the first transfer portion 61 of the transfer unit 6 are disposed can be easily ensured in the conveyance path 5a.

According to the first embodiment, as described above, in the mounting target working device 100, after the head unit 7 performs the mounting operation on the second mounting target P2, the second transfer portion 62 receives the second mounting target P2, the second transfer portion 62 delivers the second mounting target P2 to the first transfer portion 61, and the first transfer portion 61 delivers the second mounting target P2 to the conveyance unit 5. Accordingly, the second mounting target P2 can be easily transferred from the second mounting target work area 2 to the conveyance unit 5 by the first transfer portion 61 and the second transfer portion 62 of the transfer unit 6.

Second Embodiment

A second embodiment is now described with reference to FIGS. 15 and 16. In this second embodiment, an example in which a first transfer portion of a transfer unit is disposed in a first mounting target work area of a conveyance path unlike the aforementioned first embodiment is described. The same structures as those of the aforementioned first embodiment are denoted by the same reference numerals in the figures, and description thereof is omitted.

(Structure of Mounting Target Working Device)

A mounting target working device 200 according to the second embodiment of the present disclosure differs from the mounting target working device 100 according to the aforementioned first embodiment in that the mounting target working device 200 includes a first mounting target holder 103, as shown in FIG. 15.

In the second embodiment, the first mounting target holder 103 is disposed at substantially the same position as a first transfer portion 61 of a transfer unit 6 in a conveyance path 5a. Specifically, the first mounting target holder 103 is disposed in a space formed between a pair of conveyors 61a of the first transfer portion 61, which are spaced apart from each other in an X direction. Consequently, in the second embodiment, the first transfer portion 61 is disposed in a first mounting target work area 101 of the conveyance path 5a, and the first mounting target work area 101 (first mounting target holder 103) and a second mounting target work area 2 (second mounting target holder 4) are disposed side by side in a Y direction. In the second embodiment, a transfer stop position B2 and a mounting stop position B4 are substantially the same as each other.

Figure 16:
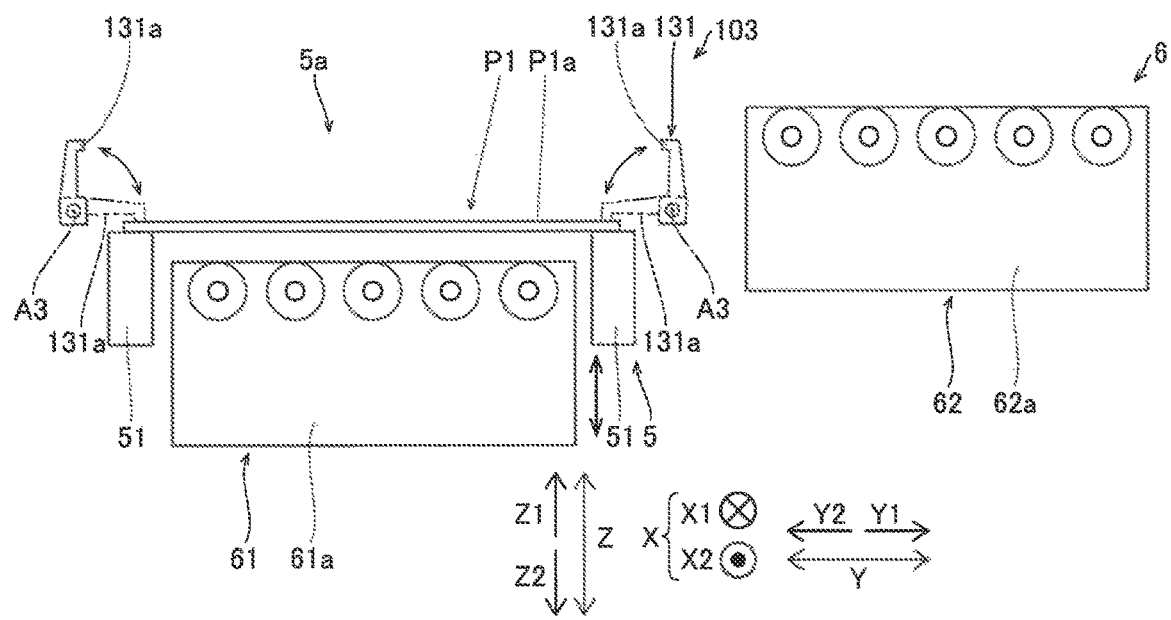
FIG. 16 is a diagram showing a first mounting target holder and a transfer unit of the mounting target working device according to the second embodiment, as viewed in a conveyance direction.

In the second embodiment, as shown in FIG. 16, the first mounting target holder 103 includes a mounting target fixing unit 131. The mounting target fixing unit 131 is a clamp mechanism that fixes a first mounting target P1 when a head unit 7 performs a mounting operation on the first mounting target P1 in the first mounting target work area 101. The mounting target fixing unit 131 includes a pair of clamps 131a spaced apart from each other in the Y direction, and fixes both ends of the first mounting target P1 in the Y direction by the pair of clamps 131a.

The pair of clamps 131a of the mounting target fixing unit 131 are movable between retracted positions at which the pair of clamps 131a do not contact the second mounting target P2 (placement member 90) moved by the first transfer portion 61 and fixing positions at which the pair of clamps 131a fix the first mounting target P1 when the pair of clamps 131a do not fix the first mounting target P1 and the second mounting target P2 is delivered to the first transfer portion

61. Specifically, the pair of clamps 131*a* are movable between the retracted positions and the fixing positions by rotating about a rotation axis A3 that extends along the X direction. Furthermore, the pair of clamps 131*a* rotate from the fixing positions to the retracted positions such that a width between the pair of clamps 131*a* in the Y direction is increased. The pair of clamps 131*a* are located at the retracted positions when the first mounting target P1 or the second mounting target P2 is transferred and when the second mounting target P2 is moved by the first transfer portion 61 of the transfer unit 6, and the pair of clamps 131*a* are located at the fixing positions when fixing the first mounting target P1.

Therefore, in the mounting target working device 200, the first transfer portion 61 of the transfer unit 6 receives the second mounting target P2 from a conveyance unit 5 in a state in which the mounting target fixing unit 131 is retracted to the retracted position, and moves upward (Z1 direction) to a delivery position. In the second embodiment, the first transfer portion 61 disposed at the delivery position passes over (Z1 direction) the conveyance unit 5 and the pair of clamps 131*a* disposed at the retracted positions, and delivers the second mounting target P2 (placement member 90) to a second transfer portion 62.

The remaining structures of the second embodiment are similar to those of the aforementioned first embodiment.

Effects of Second Embodiment

According to the second embodiment, the following effects are achieved.

According to the second embodiment, as described above, the first transfer portion 61 is disposed in the first mounting target work area 101 of the conveyance path 5*a*. Accordingly, as compared with the case in which the first transfer portion 61 of the transfer unit and the first mounting target work area 101 are disposed at different positions in the conveyance path 5*a*, the conveyance path 5*a* can be shortened, and thus the mounting target working device 200 can be miniaturized accordingly.

According to the second embodiment, as described above, the first mounting target holder 103 includes the mounting target fixing unit 131 that fixes the first mounting target P1 when the head unit 7 performs the mounting operation on the first mounting target P1 in the first mounting target work area 101. Furthermore, in the mounting target working device 200, in a state in which the mounting target fixing unit 131 is retracted, the first transfer portion 61 of the transfer unit 6 receives the second mounting target P2 from the conveyance unit 5. Accordingly, when the first transfer portion 61 of the transfer unit receives the second mounting target P2 from the conveyance unit 5, the mounting target fixing unit 131 of the first mounting target holder 103 can be prevented from hindering the transfer operation.

The remaining effects of the second embodiment are similar to those of the aforementioned first embodiment.

Third Embodiment

A third embodiment is now described with reference to FIG. 17. In this third embodiment, an example in which both a first mounting target work area and a second mounting target work area are disposed in a conveyance path unlike the aforementioned first and second embodiments is described. The same structures as those of the aforementioned first embodiment are denoted by the same reference numerals in the figures, and description thereof is omitted.

(Structure of Mounting Target Working Device)

Figure 17:
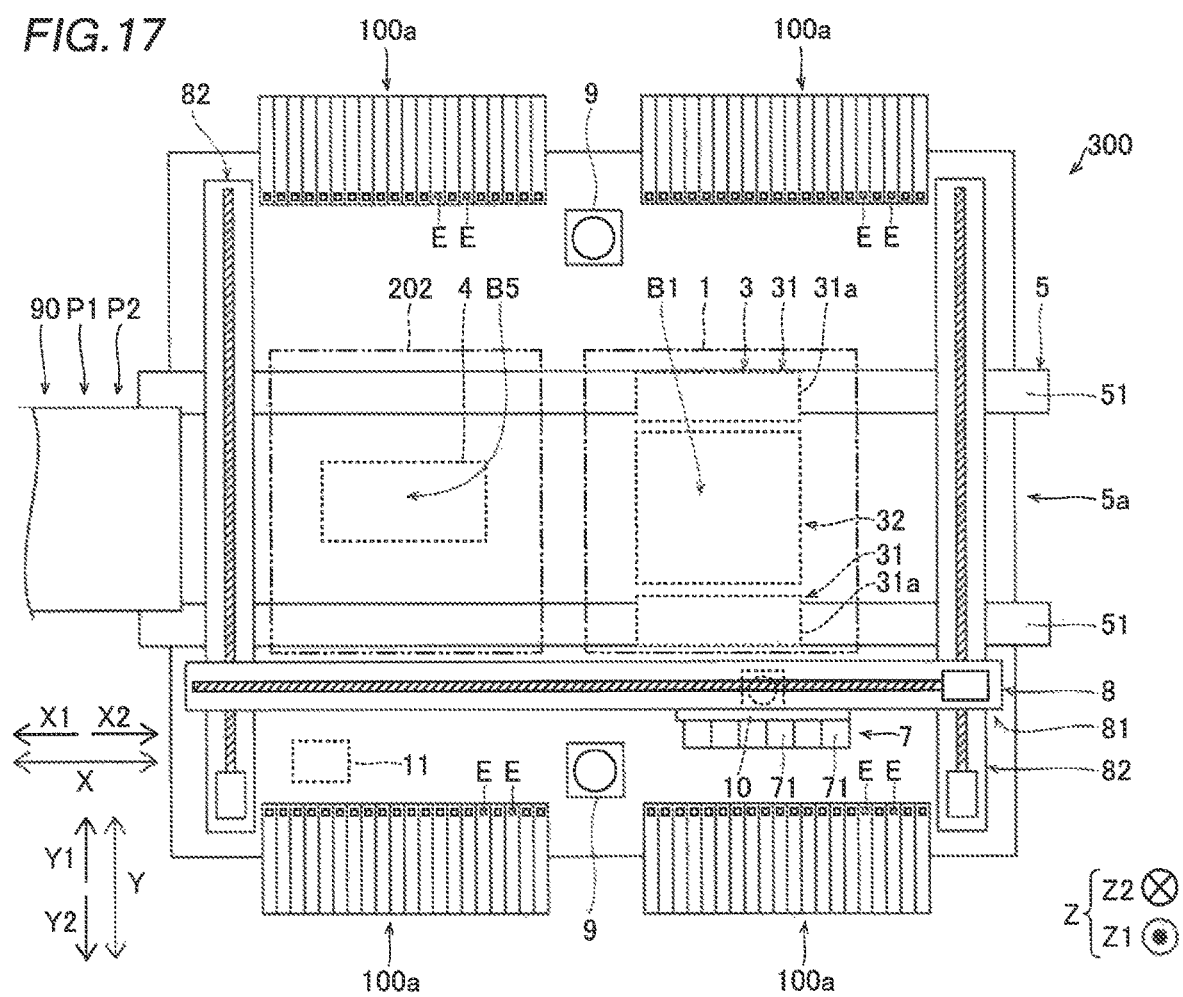
FIG. 17 is a diagram showing the overall structure of a mounting target working device according to a third embodiment.

A mounting target working device 300 according to the third embodiment of the present disclosure differs from the mounting target working device 100 according to the aforementioned first embodiment in that a second mounting target holder 4 is disposed in a conveyance path 5*a*, and a transfer unit 6 is not provided, as shown in FIG. 17. Consequently, in the third embodiment, a second mounting target work area 202 is disposed in the conveyance path 5*a*, and a first mounting target work area 1 (first mounting target holder 3) and the second mounting target work area 202 (second mounting target holder 4) are disposed side by side in an X direction. Furthermore, in the third embodiment, a holding stop position B5 is located in the conveyance path 5*a*.

The remaining structures of the third embodiment are similar to those of the aforementioned first embodiment.

Effects of Third Embodiment

According to the third embodiment, the following effects are achieved.

According to the third embodiment, as described above, the second mounting target work area 202 is disposed in the conveyance path 5*a*. Accordingly, unlike the case in which the second mounting target work area 202 is disposed outside the conveyance path 5*a*, it is not necessary to provide a device that transfers a second mounting target P2 from the conveyance path 5*a* to the second mounting target work area 202 disposed outside the conveyance path 5*a*. Consequently, the structure of the mounting target working device 300 can be simplified. Furthermore, it is not necessary to transfer the second mounting target P2 from the conveyance path 5*a* to the second mounting target work area disposed outside the conveyance path 5*a*, and thus as compared with the case in which the second mounting target work area is disposed outside the conveyance path 5*a*, the time taken between when the second mounting target P2 is carried into the device and when the second mounting target P2 is disposed in the second mounting target work area 202 can be shortened.

The remaining effects of the third embodiment are similar to those of the aforementioned first embodiment.

Modified Examples

The embodiments disclosed this time must be considered as illustrative in all points and not restrictive. The scope of the present disclosure is not shown by the above description of the embodiments but by the scope of claims for patent, and all modifications (modified examples) within the meaning and scope equivalent to the scope of claims for patent are further included.

For example, while the example in which the head unit includes the mounting heads that mount the components on the bonding member such as a solder has been shown in each of the aforementioned first to third embodiments, the present disclosure is not restricted to this.

For example, the head unit may include probe heads that inspect the mounting target. In such a case, the first mounting target work area is an area in which the head unit performs an inspection operation on the first mounting target having a simple shape, and the second mounting target work area is an area in which the head unit performs the inspection operation on the second mounting target having a complicated shape. Thus, in one mounting target working device, the probe heads can inspect both the first mounting target having a simple shape and the second mounting target having a complicated shape.

Alternatively, the head unit may include insertion heads that insert, into the mounting target, lead components to be inserted into through-holes formed in the mounting target. In such a case, the first mounting target work area is an area in which the head unit performs an insertion operation on the first mounting target having a simple shape, and the second mounting target work area is an area in which the head unit performs the insertion operation on the second mounting target having a complicated shape. Thus, in one mounting target working device, the insertion heads can insert the lead components into both the first mounting target having a simple shape and the second mounting target having a complicated shape. Furthermore, when the lead components are inserted, a clinching operation for bending leads of the lead components inserted into the through-holes, a cutting operation for cutting the leads of the lead components inserted into the through-holes, or a spot reflow operation for heating a bonding member such as a solder applied to the leads of the lead components may be further performed.

Alternatively, the head unit may include application heads that applies a bonding member such as a solder to the mounting target. In such a case, the first mounting target work area is an area in which the head unit performs an application operation on the first mounting target having a simple shape, and the second mounting target work area is an area in which the head unit performs the application operation on the second mounting target having a complicated shape. Thus, in one mounting target working device, the application heads can apply the bonding member to both the first mounting target having a simple shape and the second mounting target having a complicated shape.

Alternatively, the head unit may include at least two of mounting heads, probe heads, insertion heads, and application heads. For example, the head unit may include the mounting heads and the application heads. In such a case, in one mounting target working device, the mounting heads can mount the components on a bonding member applied by the application heads.

While the example in which the first mounting target work area (first mounting target holder) and the second mounting target work area (second mounting target holder) are disposed at different positions from each other has been shown in each of the aforementioned first to third embodiments, the present disclosure is not restricted to this. For example, the first mounting target work area (first mounting target holder) and the second mounting target work area (second mounting target holder) may be disposed at substantially the same position.

While the example in which the second mounting target is conveyed in a state in which the same is placed on the placement member has been shown in each of the aforementioned first to third embodiments, the present disclosure is not restricted to this. According to the present disclosure, the second mounting target itself may be directly conveyed without being placed on the placement member.

While the example in which the first mounting target work area (first mounting target holder) is disposed in the conveyance path, and the second mounting target work area (second mounting target holder) is disposed outside the conveyance path has been shown in each of the aforementioned first and second embodiments, the present disclosure is not restricted to this. For example, the second mounting target work area (second mounting target holder) may be disposed in the conveyance path, and the first mounting target work area (first mounting target holder) may be disposed outside the conveyance path.

While the example in which the transfer unit transfers the second mounting target (placement member) from the conveyance unit to the second mounting target work area by the two transfer mechanisms (the first transfer portion and the second transfer portion) has been shown in each of the aforementioned first and second embodiments, the present disclosure is not restricted to this. For example, the transfer unit may transfer the second mounting target from the conveyance unit to the second mounting target work area by one or more than two transfer mechanisms.

While the example in which the first transfer portion of the transfer unit passes over the conveyance unit and delivers the second mounting target (placement member) to the second transfer portion has been shown in each of the aforementioned first and second embodiments, the present disclosure is not restricted to this. For example, after receiving the second mounting target (placement member) from the conveyance unit, the first transfer portion of the transfer unit may pass under the conveyance unit and deliver the second transfer target (placement member) to the second transfer portion.

While the example in which when the second mounting target (placement member) held by the second mounting target holder is rotated or inclined, the pair of conveyors of the second transfer portion of the transfer unit are retracted to the positions at which the pair of conveyors do not contact the rotated or inclined second mounting target (placement member) has been shown in each of the aforementioned first and second embodiments, the present disclosure is not restricted to this. According to the present disclosure, when the second mounting target (placement member) held by the second mounting target holder is rotated or inclined, the pair of conveyors of the second transfer portion of the transfer unit may not be retracted unless the same contact the rotated or inclined second mounting target (placement member).

While the example in which the pair of clamps of the mounting target fixing unit rotate from the fixing positions to the retracted positions such that the width between the pair of clamps in the Y direction is increased has been shown in the aforementioned third embodiment, the present disclosure is not restricted to this. For example, the pair of clamps of the mounting target fixing unit may slide from the fixing positions to the retracted positions such that the width between the pair of clamps in the Y direction is increased.

What is claimed is:
1. A substrate working device comprising:
   a head unit;
   a flat plate shaped substrate work area in which the head unit performs an operation on a flat plate shape substrate mounting a component thereon and having a flat plate shape;
   a three-dimensional shape substrate work area in which the head unit performs the operation on a three-dimensional shape substrate mounting the component thereon and having a three-dimensional shape as compared with the flat plate shape substrate;
   a conveyance unit including a conveyance path through which the flat plate shape substrate and the three-dimensional shape substrate are carried in, conveyed, and carried out;
   a flat plate shape substrate holder configured to hold the flat plate shape substrate when the head unit performs the operation on the flat plate shape substrate in the flat plate shape substrate work area; and a three-dimensional shape substrate holder configured to hold the three-dimensional shape substrate and move the held three-dimensional shape substrate along an upward-downward direction, or rotate or incline the held three-dimensional shape substrate when the head unit performs the operation on the three-dimensional shape substrate in the three-dimensional shape substrate work area, wherein the flat plate shape substrate work area is an area in which the flat plate shape substrate holder is disposed, the three-dimensional shape substrate work area is an area in which the three-dimensional shape substrate holder is disposed, the flat plate shape substrate work area is disposed in the conveyance path of the conveyance unit, and the three-dimensional shape substrate work area is disposed outside the conveyance path of the conveyance unit.

2. The substrate working device according to claim 1, wherein the flat plate shape substrate work area and the three-dimensional shape substrate work area are disposed at different positions from each other.

3. The substrate working device according to claim 1, further comprising a transfer unit configured to receive the three-dimensional shape substrate from the conveyance unit and transfer the three-dimensional shape substrate to the three-dimensional shape substrate work area.

4. The substrate working device according to claim 3, wherein the transfer unit includes:
a first transfer unit disposed in the conveyance path and that is movable in the upward-downward direction and configured to pick up and receive the three-dimensional shape substrate from the conveyance unit; and
a second transfer unit disposed outside the conveyance path and that is configured to receive the three-dimensional shape substrate from the first transfer unit and transfer the three-dimensional shape substrate to the three-dimensional shape substrate work area; and
the first transfer unit, the second transfer unit, and the three-dimensional shape substrate work area are disposed side by side in a direction orthogonal to a conveyance direction in the conveyance path.

5. The substrate working device according to claim 4, wherein the first transfer unit is disposed at a different position from that of the flat plate shaped substrate work area in the conveyance path.

6. The substrate working device according to claim 4, wherein the first transfer unit is disposed in the flat plate shaped substrate work area of the conveyance path.

7. The substrate working device according to claim 6, wherein the flat plate shaped substrate holder includes a mounting target fixing unit configured to fix the flat plate shaped substrate when the head unit performs the operation on the flat plate shaped substrate in the flat plate shaped substrate work area; and
in a state in which the mounting target fixing unit is retracted, the first transfer unit of the transfer unit receives the three-dimensional shape substrate from the conveyance unit.

8. The substrate working device according to claim 4, wherein after the head unit performs the operation on the three-dimensional shape substrate, the second transfer unit receives the three-dimensional shape substrate, the second transfer unit delivers the three-dimensional shape substrate to the first transfer unit, and the first transfer unit delivers the three-dimensional shape substrate to the conveyance unit.

9. The substrate working device according to claim 5, wherein after the head unit performs the operation on the three-dimensional shape substrate, the second transfer unit receives the three-dimensional shape substrate, the second transfer unit delivers the three-dimensional shape substrate to the first transfer unit, and the first transfer unit delivers the three-dimensional shape substrate to the conveyance unit.

10. The substrate working device according to claim 6, wherein after the head unit performs the operation on the three-dimensional shape substrate, the second transfer unit receives the three-dimensional shape substrate, the second transfer unit delivers the three-dimensional shape substrate to the first transfer unit, and the first transfer unit delivers the three-dimensional shape substrate to the conveyance unit.

11. The substrate working device according to claim 7, wherein after the head unit performs the operation on the three-dimensional shape substrate, the second transfer unit receives the three-dimensional shape substrate, the second transfer unit delivers the three-dimensional shape substrate to the first transfer unit, and the first transfer unit delivers the three-dimensional shape substrate to the conveyance unit.

* * * * *